United States Patent
Xun et al.

(10) Patent No.: US 9,685,972 B1
(45) Date of Patent: Jun. 20, 2017

(54) ASYNCHRONOUS SUCCESSIVE APPROXIMATION REGISTER ANALOG-TO-DIGITAL CONVERTER CIRCUIT AND METHOD FOR CONFIGURING THE SAME

(71) Applicant: Semiconductor Manufacturing International (Shanghai) Corporation, Shanghai (CN)

(72) Inventors: Benpeng Xun, Shanghai (CN); Fei Liu, Shanghai (CN); Mengmeng Guo, Shanghai (CN); Hua Tang, Shanghai (CN); Haifeng Yang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/187,647

(22) Filed: Jun. 20, 2016

(51) Int. Cl.
  *H03M 1/12* (2006.01)
  *H03M 1/46* (2006.01)
  *H03K 5/24* (2006.01)
  *H03K 19/21* (2006.01)

(52) U.S. Cl.
  CPC .............. *H03M 1/46* (2013.01); *H03K 5/24* (2013.01); *H03K 19/21* (2013.01)

(58) Field of Classification Search
  CPC ........ H03M 1/468; H03M 1/46; H03M 1/462; H03M 1/804; H03M 1/06; H03M 1/12; H03M 1/1076; H03M 1/38
  USPC ................... 341/118–121, 155, 150, 172
  See application file for complete search history.

(56) References Cited

U.S. PATENT DOCUMENTS

| | | | | |
|---|---|---|---|---|
| 6,225,937 B1* | 5/2001 | Butler | ................ | H03M 1/0872 341/118 |
| 8,872,691 B1* | 10/2014 | Stepanovic | ............. | H03M 1/06 341/144 |
| 9,484,945 B1* | 11/2016 | Wan | ......................... | H03M 1/46 |
| 2012/0032824 A1* | 2/2012 | Yoshioka | ............... | H03L 7/0812 341/110 |
| 2014/0022105 A1* | 1/2014 | Chen | ....................... | H03M 1/38 341/161 |
| 2014/0145868 A1* | 5/2014 | Sugimoto | ............... | H03M 1/38 341/161 |

* cited by examiner

*Primary Examiner* — Linh Nguyen
(74) *Attorney, Agent, or Firm* — Anova Law Group, PLLC

(57) ABSTRACT

The present disclosure provides an asynchronous successive approximation register analog-to-digital conversion (ASAR ADC) circuit, including: a comparator circuit, an XOR gate circuit, an ASAR logic circuit, a metastable state detection (MD) circuit, a capacitor, and a digital-to-analog converter (DAC) circuit. The comparator circuit has a first input terminal connected to an analog signal, a first output terminal of the comparator circuit respectively connected to a first input terminal of the ASAR circuit and a first input terminal of the XOR gate circuit, a second output terminal of the comparator circuit respectively connected to a second input terminal of the ASAR gate circuit and a second input terminal of the XOR gate circuit, and an enable signal input terminal connected to a control signal output terminal of the ASAR logic circuit. The XOR gate circuit has an output terminal connected to a third input terminal of the ASAR logic circuit.

20 Claims, 4 Drawing Sheets

ASYNCHRONOUS SUCCESSIVE APPROXIMATION REGISTER ANALOG-TO-DIGITAL CONVERTER CIRCUIT AND METHOD FOR CONFIGURING THE SAME

FIELD OF THE DISCLOSURE

The present disclosure generally relates to the field of semiconductor technology, more particularly, relates to an asynchronous successive approximation register analog-to-digital converter (ASAR ADC) circuit and a method for configuring the ASAR ADC circuit.

BACKGROUND

An asynchronous successive approximation register analog-to-digital conversion (ASAR ADC) circuit is a common analog-to-digital (A/D) converter. FIG. 1 illustrates a conventional ASAR ADC 10, which often includes a comparator (Comp) circuit 102, an XOR gate circuit 103, an asynchronous successive approximation register (ASAR) logic circuit 104, and a digital-to-analog conversion (DAC) circuit 101.

In the conventional ASAR DAC circuit 10, the input signal $V_{in}$ is connected to the comparator circuit 102. The comparator circuit 102 outputs voltages $V_{comp}$ at the output terminals. The output terminals of the comparator circuit 102 are connected to the XOR gate circuit 103 and are further connected to the ASAR logic circuit 104. The ASAR logic circuit 104 performs a logical operation based on the input signal $V_{in}$ and generates a digital signal $V_{out}$ as an output signal. The outputted digital signal $V_{out}$ is connected to the control signal input terminal of the DAC circuit 101. The output signal of the DAC circuit 101 is connected to the other input terminal of the comparator circuit 102.

Compared to a synchronous successive approximation register analog-to-digital conversion (SSAR ADC) circuit, an ASAR ADC circuit is faster. However, the comparator circuit in a conventional ASAR ADC circuit often has metastable state behavior or other metastable state issues.

BRIEF SUMMARY OF THE DISCLOSURE

One aspect of the present disclosure provides an asynchronous successive approximation register analog-to-digital conversion (ASAR ADC) circuit, including: a comparator circuit, an XOR gate circuit, an ASAR logic circuit, a metastable state detection (MD) circuit, a capacitor, and a digital-to-analog converter (DAC) circuit. The comparator circuit has a first input terminal connected to an analog signal, a first output terminal of the comparator circuit respectively connected to a first input terminal of the ASAR circuit and a first input terminal of the XOR gate circuit, a second output terminal of the comparator circuit respectively connected to a second input terminal of the ASAR gate circuit and a second input terminal of the XOR gate circuit, and an enable signal input terminal connected to a control signal output terminal of the ASAR logic circuit. The XOR gate circuit has an output terminal connected to a third input terminal of the ASAR logic circuit and a first input terminal of the MD circuit. The MD circuit has a second input terminal connected to a control signal output terminal of the ASAR logic circuit, and an output terminal of the MD circuit connected to the first input terminal or the second input terminal of the comparator circuit through the capacitor. The DAC circuit has an input terminal connected to an output terminal of the ASAR logic circuit, and an output terminal of the DAC circuit connected to the second input terminal of the comparator circuit. The output terminal of the ASAR logic circuit is connected to a digital signal output terminal of the ASAR DAC circuit.

Another aspect of the present disclosure provides a method for configuring an asynchronous successive approximation register analog-to-digital conversion (ASAR ADC) circuit, the ASAR ADC circuit having a comparator circuit, an XOR gate circuit, an ASAR logic circuit, a metastable state detection (MD) circuit, a capacitor, and a digital-to-analog converter (DAC) circuit, including connecting a first input terminal of the comparator circuit to an analog signal, a first output terminal of the comparator circuit respectively to a first input terminal of the ASAR circuit and a first input terminal of the XOR gate circuit, a second output terminal of the comparator circuit respectively to a second input terminal of the ASAR gate circuit and a second input terminal of the XOR gate circuit, and an enable signal input terminal of the comparator circuit to a control signal output terminal of the ASAR logic circuit; connecting an output terminal of the XOR gate circuit to a third input terminal of the ASAR logic circuit and a first input terminal of the MD circuit; and connecting a second input terminal of the MD circuit to a control signal output terminal of the ASAR logic circuit, and an output terminal of the MD circuit to the first input terminal or the second input terminal of the comparator circuit through the capacitor. The method further includes connecting an input terminal of the DAC circuit to an output terminal of the ASAR logic circuit, and an output terminal of the DAC circuit to the second input terminal of the comparator circuit. The output terminal of the ASAR logic circuit is connected to a digital signal output terminal of the ASAR DAC circuit.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

To solve the metastable state behavior in conventional ASAR ADC circuits, embodiments of the present disclosure provide an ASAR ADC circuit, which, for example, are illustrated in connection with FIGS. 2-6.

Figure 1:
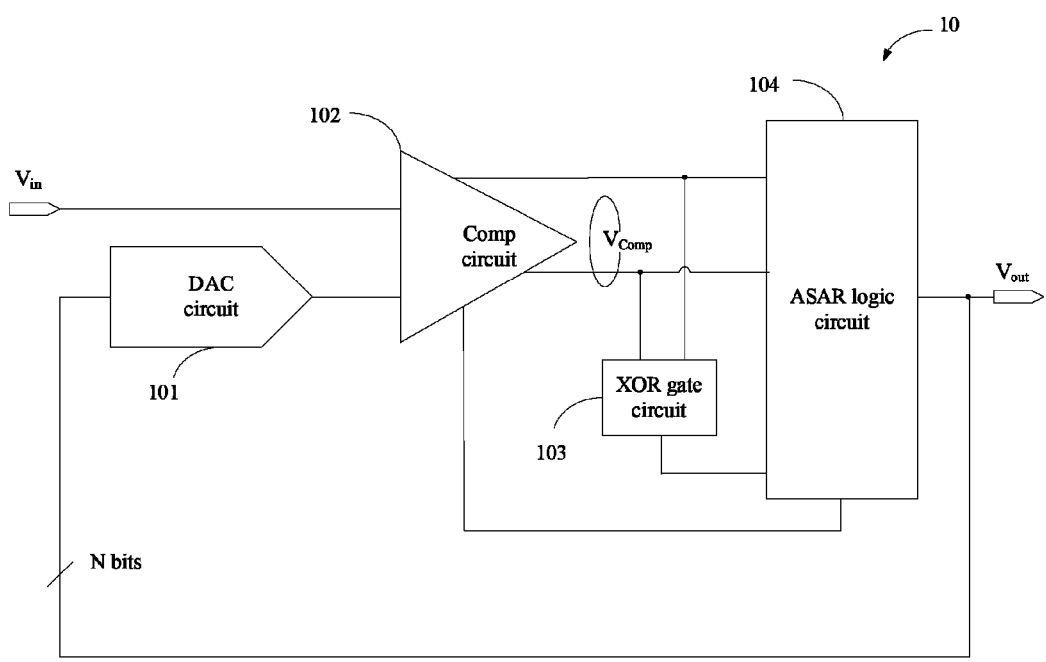
FIG. 1 illustrates a conventional ASAR ADC circuit.
Figure 2:
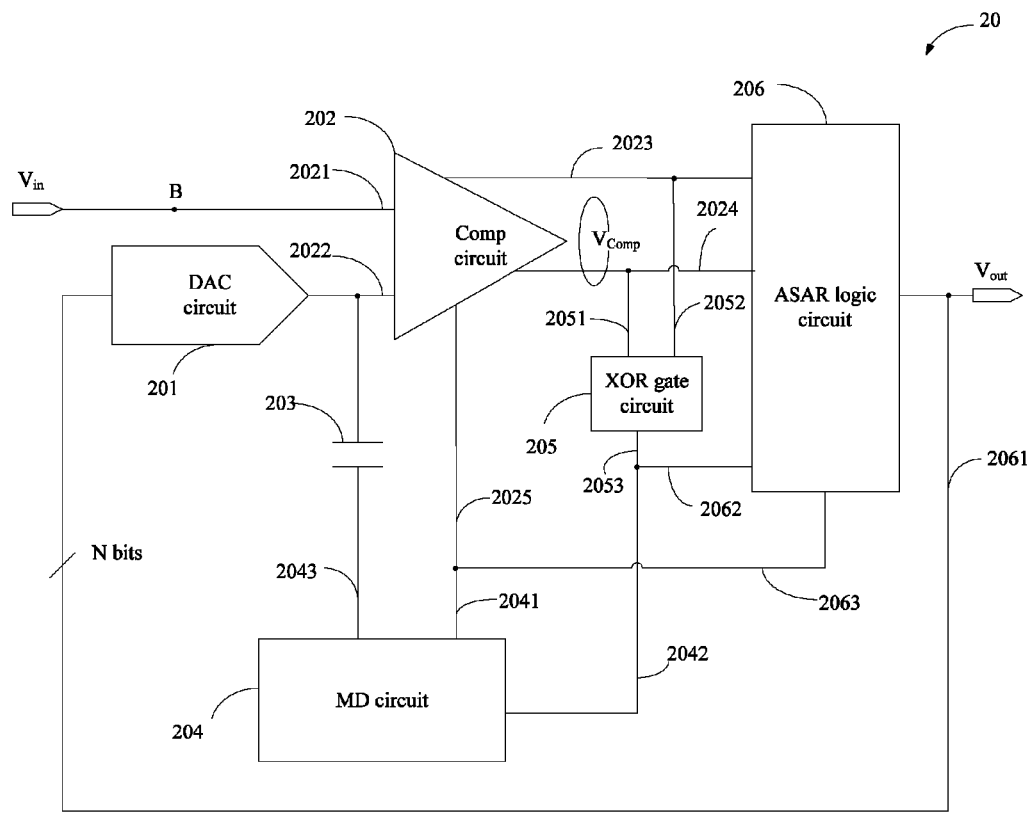
FIG. 2 illustrates an exemplary ASAR ADC circuit consistent with various disclosed embodiments of the present disclosure.

FIG. 2 illustrates an exemplary ASAR ADC circuit 20. The embodiments of the present disclosure are described in detail using the ASAR ADC circuits illustrated in FIG. 2 as an example. The ASAR ADC circuit 20 may include a comparator (Comp) circuit 202, an XOR gate circuit 205, an ASAR logic circuit 206, an MD circuit 204, a capacitor 203, and a DAC circuit 201.

The comparator circuit 202 may be configured to perform a comparison operation between the input signals applied on the first input terminal 2021 and the second input terminals 2022. The result of the comparison operation may be outputted through the first output terminal 2023 and the second output terminal 2024. The output signals outputted by the first output terminal 2023 and the second output terminal 2024 may have opposite logic voltage levels. In one embodiment, by applying the comparator circuit 202, which has two output terminals, i.e., 2023 and 2024, a desired flag signal may be generated in the subsequent processes.

The first input terminal 2021, of the comparator circuit 202, may be connected to an analog signal that needs analog-to-digital conversion. The first output terminal 2023 and the second output terminal 2024, of the comparator circuit 202, may be connected to the first and second input terminals, i.e., 2051 and 2052, respectively, of the XOR gate circuit 205. The XOR gate circuit 205 may be configured to perform XOR operations on the output signals of the comparator circuit 202. Because the comparator circuit 202 only output different output signals or output signals of opposite logic levels from the first output terminal 2023 and the second output terminal 2024 when the comparison is completed, the flag signal reflecting the result of the comparison, outputted by the XOR gate circuit 205, may indicate the completion of one comparison operation. The first output terminal 2023 and the second output terminal 2024 of the comparator circuit 202 may also be connected to the first and second input terminals of the ASAR logic circuit 206 to provide the result of the comparison operation to the ASAR logic circuit 206. Thus, the ASAR logic circuit 206 may perform corresponding logic operations.

The output terminal 2061 of the ASAR logic circuit 206 may be connected to the second input terminal 2022 of the comparator circuit 202 through the DAC circuit 201. The output terminal 2061 of the ASAR logic circuit 206 may provide a reference voltage, in the form of a N-bit digital signal, for the analog signal $V_{in}$ applied on the first input terminal 2021 of the comparator circuit 202. The output terminal 2061 of the ASAR logic circuit 206 may be connected to a digital signal output terminal $V_{out}$ of the ASAR DAC circuit. The control signal output terminal 2063 of the ASAR logic circuit 206 may be connected to the enable signal input terminal 2025 of the comparator circuit 202 and the first input terminal 2041 of the MD circuit 204. The ASAR logic circuit 206 may output a control signal to the comparator circuit 202 and the MD circuit 204. The control signal may be used to determine the operation states of the comparator circuit 202.

The second input terminal 2042 of the MD circuit 204 may be connected to the output terminal 2053 of the XOR gate circuit 205. The output terminal 2043 of the MD circuit 204 may be connected to the second input terminal 2022 of the comparator circuit 202 through the capacitor 203. Based on the control signal and the flag signal, the MD circuit 204 may determine if the comparator circuit 202 is in a metastable state. If MD circuit 204 determines the comparator circuit 202 is in a metastable state, the MD circuit 204 may output a high-level disturbance signal to the comparator circuit 202 through the capacitor 203. The high-level disturbance signal may eliminate the metastable state of the comparator circuit 202.

In the present disclosure, by applying an MD circuit 204, the metastable state of the disclosed ASAR ADC circuit may be recognized. The output signal of the MD circuit 204 may be connected to the input terminal of the comparator circuit 202 through the capacitor 203 such that the metastable state of the comparator circuit 202 may be eliminated. Accordingly, the disclosed ASAR ADC circuit may complete the comparison operations of N bits in one clock cycle. The performance of the disclosed ASAR ADC circuit may be improved.

Figure 3:
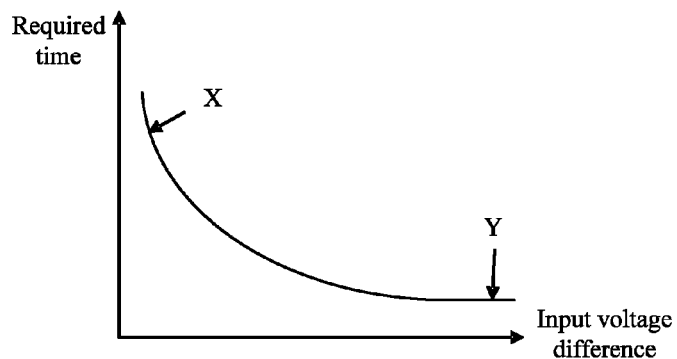
FIG. 3 illustrates a correlation between time required to complete a comparison operation and input voltage difference consistent with various disclosed embodiments of the present disclosure.

Comparator circuits often have metastable state behavior. FIG. 3 illustrates the correlation between the input voltage difference and the time required to complete a comparison operation. The input voltage difference represents the voltage difference between the input signals applied on the two input terminals of the comparator circuit. The x axis represents the input voltage difference, and the y axis represents the time required to complete a comparison operation. For illustrative purposes, the x axis is labeled as "Input voltage difference" and the y axis is labeled as "Required time". As shown in FIG. 3, when the input voltage difference is small, e.g., at point X, it may require longer time for the comparator circuit to compete a comparison operation and output an accurate result of the comparison operation. When the input voltage difference is sufficiently large, e.g., at point Y, the time required to complete a comparison operation may be stabilized in a minimum device delay time.

Figure 4:
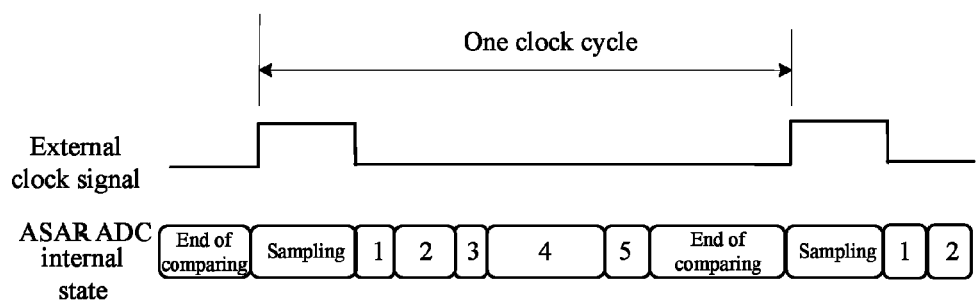
FIG. 4 illustrates a correlation between an internal state of an ASAR ADC circuit and an external clock signal consistent with various disclosed embodiments of the present disclosure.

FIG. 4 illustrates a correlation between the internal state or internal operations of an ASAR ADC circuit and an external clock signal. It can be shown that, although each of the N bits may require a different time length for the comparison operation, the ASAR ADC circuit needs to complete the comparison operations of all N bits in one clock cycle. For example, N may be 5, as shown in FIG. 4. In one clock cycle, as shown in FIG. 4, the ASAR ADC circuit may need to complete a sampling process, the comparison operations for the 5 bits, and an end od comparing process. The comparison operation for one bit may be the same as or different from the comparison operations for other bits.

However, metastable state behavior of the ASAR ADC may cause metastable events to occur, which causes metastable bits. More time may be needed to complete the comparison operations. As a result, the ASAR ADC may not complete the comparison operations of the N bits in one clock cycle. The performance of the ASAR ADC circuits may be adversely affected, and the application of ASAR ADC circuits may be greatly limited.

In the embodiments of the present disclosure, the MD circuit is used to recognize the metastable state of the ASAR ADC circuit. The output of the MD circuit may also be connected to an input terminal of the comparator circuit such that the metastable state of the comparator circuit may be eliminated in a sufficiently short time. The ASAR ADC circuit may complete the comparison operations for the N bits in one clock cycle. The disclosed ASAR ADC circuit may have improved performance.

In the disclosed ASAR ADC circuit illustrated in FIG. 2, the ASAR logic circuit 206 may be configured to control the disclosed ASAR ADC circuit 20. The ASAR logic circuit 206 may include suitable logic circuits and registers. Based on the number of bits that undergoes the analog-to-digital conversion, the ASAR logic circuit 206 may include different numbers of registers and may have different circuit structures.

The working principles of an exemplary ASAR logic circuit 206 may be described as follows. At the beginning of the analog-to-digital conversion, the ASAR logic circuit 206 may clear the registers. When starting the analog-to-digital conversion, a clock pulse may be configured to set the highest bit of the register to 1 such that the bits outputted by the ASAR logic circuit 206 becomes 100 . . . 0. The DAC circuit 201 may convert the outputted bits, i.e., 100 . . . 0, to a corresponding analog voltage and send the analog voltage to the second input terminal 2022 of the comparator circuit 202. The analog voltage may be compared to the voltage, i.e., $V_{in}$ applied on the first input terminal 2021 of the comparator circuit 202.

If the analog voltage, outputted by the DAC circuit 201 by converting the N bits and applied on the second input terminal 2022 of the comparator circuit 202, is higher than the input analog signal $V_{in}$, the N bits outputted by the ASAR logic circuit 206 may be too large. In this case, the disclosed ASAR ADC circuit may clear the highest bit of the N bits outputted by ASAR logic circuit 206. If the analog voltage is lower than the input analog signal $V_{in}$, the N bits outputted by the ASAR logic circuit may be sufficiently small. In this case, the disclosed ASAR ADC circuit may retain the highest bit of the N bits outputted by ASAR logic circuit 206. Further, a similar process may be performed to set the second highest bit of the N bits outputted by the ASAR logic circuit 206 to be 1, and a similar comparison operation may be performed to determine if the 1 at the second highest bit of the bits should be retained. Similar processes may be performed until the lowest bit of the N bits is compared to the input analog signal $V_{in}$. After the comparison operations are completed, the internal state of the register may represent a desired digital output. That is, a successive approximation and conversion process may be similar to using a scale to measure the unknown weight of an object, except that the balance weight applied each time is half of the balance weight applied last time. In the disclosed ASAR ADC circuit, the output terminal of the MD circuit 204 may be connected to an input terminal or the second input terminal 2022 of the comparator circuit 202 through a capacitor 203, so that the metastable state of the disclosed ASAR ADC circuit may be eliminated in a sufficiently short time. No change or modification needs to be made to the ASAR logic circuit. The complexity level of the disclosed ASAR ADC circuit may be reduced.

In some embodiments, the comparator circuit 202 may be a full differential input-output comparator circuit.

In some embodiments, the MD circuit 204 may include N AND gate circuits and a NAND gate circuit, where N is an integer greater than zero. The first input terminal of the first AND gate circuit may be connected to the control signal output terminal 2063 of the ASAR logic circuit 206. The first input terminal of the $n^{th}$ AND gate circuit may be connected to the output terminal of the $(n-1)^{th}$ AND gate circuit, where $2 \leq n \leq N$. The input terminal 2042 of the NAND gate circuit may be connected to the output terminal 2053 of the XOR gate circuit 205. The output terminal of the NAND gate circuit may be connected to the second input terminals of the N AND gate circuits. The output terminal of the $N^{th}$ AND gate circuit may be connected to a digital signal output terminal of the MD circuit 204. By changing the value of N, i.e., the number of AND gate circuits, the internal structure of the MD circuit 204 may be changed to set different maximum tolerance times. Thus, the criterion to determine the metastable state of the comparator circuit 202 may be adjusted to adapt to different applications. The ASAR ADC circuit may be more flexibly designed.

Figure 5:
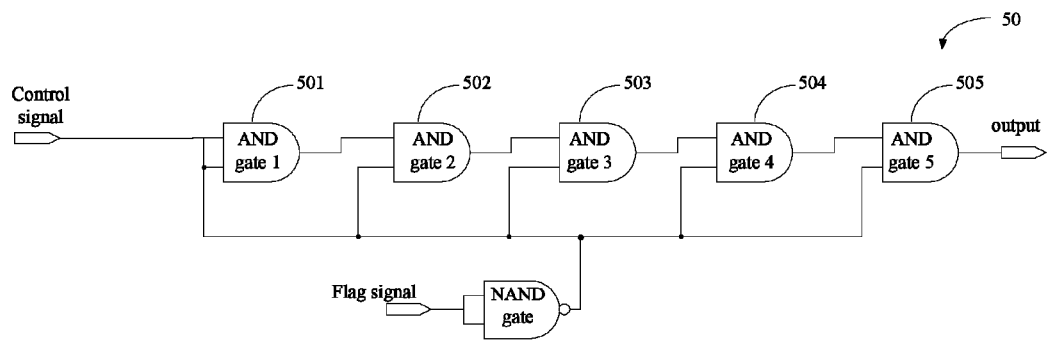
FIG. 5 illustrates an exemplary metastable state detection (MD) circuit consistent with various disclosed embodiments of the present disclosure.

FIG. 5 illustrates an exemplary MD circuit 204 used in various embodiments of the present disclosure, where N equals 5. That is, the MD circuit 204 may include five AND gate circuits, i.e., AND gates 501-505, and 1 NAND gate circuit. The first input terminal of the first AND gate circuit 501 or first AND gate 1 may be connected to the control signal output terminal of the ASAR logic circuit 206, which outputs a control signal. The control signal may thus be inputted to the MD circuit 204. The input terminal of the NAND gate circuit or NAND gate may be connected to the output terminal 2053 of the XOR gate circuit 205 to receive a flag signal outputted by the XOR gate circuit 205. The output terminal of the NAND gate may be connected to the second input terminals of the five AND gate circuits, i.e., AND gate 1-AND gate 5. The output terminal of AND gate 5 may be the digital signal output terminal or output terminal 2043 of the MD circuit 204.

In some embodiments, the output signal of the MD circuit 204, outputted from the output terminal 2043, may be sent to the second input terminal 2022 of the comparator circuit 202 through the capacitor 203. The capacitance of the capacitor 203 may be in the order of femto farad (fF). For example, the capacitance of the capacitor 23 may be about 100 fF. A capacitor 203 with a capacitance in the order of femto farad may couple the output signal of the MD circuit 204 to the second input terminal 2022 of the comparator circuit 202 in a sufficiently short time. Accordingly, the metastable state of the comparator circuit 202 may be eliminated in a sufficiently short time.

The DAC circuit 201 may be any suitable DAC circuits. In some embodiments, the DAC circuit 201 may be a resistor DAC circuit, i.e., a DAC only including resistors. In some other embodiments, the DAC circuit 201 may be a resistor-capacitor DAC, i.e., a DAC circuit including resistors and capacitors. In some other embodiments, the DAC circuit 201 may be a capacitor DAC circuit, i.e., a DAC only including capacitors. The specific types of DAC circuits used in the ASAR ADC circuit should be determined according to different applications and should not be limited by the embodiments of the present disclosure.

In some embodiments, a latch circuit (not shown) may be connected between the input analog signal $V_{in}$ and the first input terminal 2021 of the comparator circuit 202. For example, the latch circuit may be disposed at point B, as shown in FIG. 2, where point B may be any suitable point between the input analog signal $V_{in}$ and the first input terminal 2021. The input terminal of the latch circuit may be connected to the input analog signal $V_{in}$ and the output terminal of the latch circuit may be connected to the first input terminal 2021 of the comparator circuit 202. The latch circuit may store the input analog signal $V_{in}$ and provide a stable input signal to the comparator circuit 202. Thus, the result of the comparison operations of the comparator circuit 202 may have improved accuracy.

Figure 6:
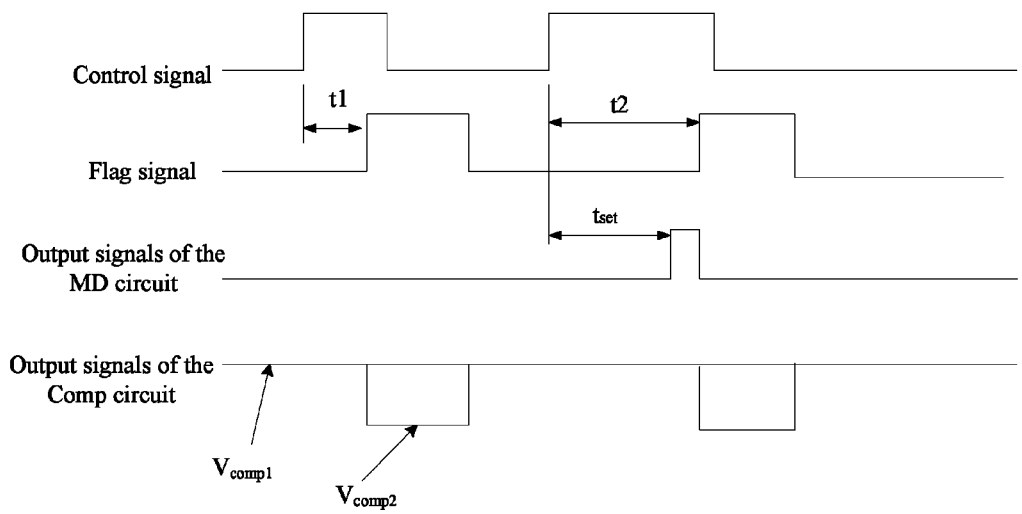
FIG. 6 illustrates an exemplary timing diagram of certain signals used in an ASAR ADC circuit consistent with various disclosed embodiments of the present disclosure.

FIG. 6 illustrate an exemplary timing diagram used in the disclosed ASAR ADC circuit. As shown in FIG. 6, when the rising edge of the control signal, outputted by the ASAR logic circuit 206, occurs, the comparator circuit 202 may start to perform a comparison operation. When the comparison operation is completed, the output voltages of the comparator circuit 202, i.e., $V_{comp1}$ outputted by output terminal 2023 and $V_{comp2}$ outputted by output terminal 2024, may be different. Accordingly, the voltage level of the flag signal may change. In the above-mentioned process, if the comparator circuit 202 uses less time than a tolerance time $t_{set}$ to complete the comparison operation for one bit, the comparison operation for the one bit may be successful. The tolerance time $t_{set}$ may be predetermined and set in advance of the comparison operation, based on the criterion to determine a metastable state. For example, the criterion may be the tolerance time $t_{set}$. If the time required for the comparator circuit 202 to complete a comparison operation, i.e., t1 shown in FIG. 6, is shorter than $t_{set}$, the comparison operation for the one bit may be successful. The time required to complete a comparison operation may be the time duration between the rising edge of the control signal and the rising edge of the coming flag signal. Otherwise, if the time required for the comparator circuit 202 to complete a comparison operation, t2 shown in FIG. 6, is longer than $t_{set}$, the output signal of the MD circuit 204 may undergo a voltage change, which may be a disturbance signal sent to the comparator circuit 202. In one embodiment, the disturbance voltage may be a high-level voltage. Accordingly, the metastable state of the comparator circuit 202 may be eliminated. The voltage level of the disturbance signal may vary according to the applications or design of the ASAR ADC circuit and should not be limited by the embodiments of the present disclosure.

It should be noted that, the tolerance time used to determine the metastable state of the comparator circuit 202 is only exemplary. In practice, other suitable criteria may also be used to determine the metastable state of the comparator circuit 202. The specific criterion should not be limited by the embodiments of the present disclosure.

The criterion to determine the metastable state of the comparator circuit 202 may be any suitable criteria. For example, in some embodiments, the tolerance time $t_{set}$ may be set as the time to complete a comparison operation when the input voltage difference of the comparator circuit is 0.5*LSB (LSB represent the least significant bit of the DAC circuit 201). For example, when the input voltage difference is smaller than 0.5*LSB, the MD circuit 204 my input a disturbance signal to the comparator circuit 202 to eliminate the metastable state of the comparator circuit 202. Accordingly, the value of N may be determined or adjusted.

It should be noted that, the $V_{comp1}$ and $V_{comp2}$ shown in FIG. 6 are only exemplary and for illustrative purposes. In practice, the voltages outputted by the output terminals, i.e., 2023 and 2024, of the comparator circuit 202 may be any suitable signals that are different from each other when a comparison operation is completed.

In the embodiments of the present disclosure, the metastable detection circuit 204 may be used to recognize the metastable state of the disclosed ASAR circuit 204. The output terminal of the MD circuit 204 may be connected to an input terminal of the comparator circuit 202 through the capacitor 202 to eliminate the metastable state of the comparator circuit 202 in a sufficiently short time. Thus, the disclosed ASAR ADC circuit may complete the comparison operations for N bits, i.e., all bits outputted by the ASAR logic circuit 206. The performance of the disclosed ASAR ADC circuit may be improved. By changing or adjusting the internal structure of the MD circuit 204, different tolerance times may be set. Accordingly, the criterion to determine a metastable state of the comparator circuit 204 may be adjusted based on different applications. The disclosed ASAR ADC circuit may be more flexibly designed and used.

In practice, when a metastable state occurs in the disclosed ASAR ADC circuit, the MD circuit 204 may eliminate the metastable state of the comparator circuit 202 through the output terminal 2043 connected to the second input terminal 2022 of the comparator circuit 202, through the capacitor 203. Little or no changes may be made to the structure of the ASAR logic circuit 206. Further, little or no changes need to be made to the logic loop of the ASAR ADC circuit. The complexity level of the disclosed ASAR ADC circuit may be reduced.

Another aspect of the present disclosure provides a method for configuring the ASAR ADC circuit. Details of the method may be referred to previous description on the structure of the disclosed ASAR ADC circuit and are not repeated herein.

Compared to conventional technology, the disclosed ASAR ADC circuit has several advantages. First, a MD circuit is used to recognize the metastable state of the disclosed ASAR ADC circuit. The output terminal of the MD circuit is connected to an input terminal of the comparator circuit to eliminate the metastable state of the comparator circuit in a desirably short time. Thus, the disclosed ASAR ADC circuit may complete the comparison operations for all N bits in one clock cycle. The disclosed ASAR ADC circuit may have improved performance.

Further, by changing or adjusting the internal structure of the MD circuit, different maximum tolerance times or tolerance times may be set. The metastable state of the comparator circuit may be determined according to different applications and/or embodiments. The disclosed ASAR ADC circuit may be more flexibly designed.

Further, when metastable state occurs in the disclosed ASAR ADC circuit, the output terminal of the MD circuit is connected to an input terminal of the comparator circuit, such that the metastable state of the comparator circuit may be eliminated. No changes need to be made to the ASAR logic circuit. The complexity level of the disclosed ASAR ADC circuit is reduced.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. An asynchronous successive approximation register analog-to-digital conversion (ASAR ADC) circuit, comprising:

a comparator circuit, an XOR gate circuit, an ASAR logic circuit, a metastable state detection (MD) circuit, a capacitor, and a digital-to-analog converter (DAC) circuit, wherein:

the comparator circuit has a first input terminal connected to an analog signal, a first output terminal of the comparator circuit respectively connected to a first input terminal of the ASAR circuit and a first input terminal of the XOR gate circuit, a second output terminal of the comparator circuit respectively connected to a second input terminal of the ASAR gate circuit and a second input terminal of the XOR gate circuit, and an enable signal input terminal connected to a control signal output terminal of the ASAR logic circuit;

the XOR gate circuit has an output terminal connected to a third input terminal of the ASAR logic circuit and a first input terminal of the MD circuit;

the MD circuit has a second input terminal connected to a control signal output terminal of the ASAR logic circuit, and an output terminal of the MD circuit connected to the first input terminal or the second input terminal of the comparator circuit through the capacitor; and the DAC circuit has an input terminal connected to an output terminal of the ASAR logic circuit, and an output terminal of the DAC circuit connected to the second input terminal of the comparator circuit, wherein:

the output terminal of the ASAR logic circuit is connected to a digital signal output terminal of the ASAR DAC circuit.

2. The ASAR ADC circuit according to claim 1, wherein: the MD circuit is configured to send a disturbance signal to the comparator circuit to eliminate a metastable state when a time required for completing a comparison operation deviates from a predetermined criterion.

3. The ASAR ADC circuit according to claim 2, wherein the predetermined criterion is a tolerance time.

4. The ASAR ADC circuit according to claim 3, wherein the tolerance time equals to a half of a least significant bit of the DAC circuit.

5. The ASAR ADC circuit according to claim 2, wherein the disturbance signal is a high-level voltage.

6. The ASAR ADC circuit according to claim 3, wherein the MD circuit comprises N AND gate circuits and one NAND gate circuit, N being an integer greater than 0, wherein:

a first input terminal of a first AND gate circuit is connected to the control signal output terminal of the ASAR logic circuit, the first input terminal of an $n^{th}$ AND gate circuit is connected to an output terminal of an $(n-1)^{th}$ AND gate circuit, n being greater than 2 and less than N; and an input terminal of the NAND gate circuit is connected to the output terminal of the XOR gate circuit, the output terminal of the NAND gate circuit is connected to second input terminals of the N AND gate circuits, and an output terminal of an $N^{th}$ AND gate circuit is connected to a digital signal output terminal of the MD circuit.

7. The ASAR ADC circuit according to claim 6, wherein a value of N is set based on the tolerance time of a metastable state of the comparator circuit.

8. The ASAR ADC circuit according to claim 1, wherein the comparator circuit includes a full differential input-output comparator.

9. The ASAR ADC circuit according to claim 1, wherein a capacitance of the capacitor is in an order of femto farad.

10. The ASAR ADC circuit according to claim 1, wherein the DAC circuit includes one or more of a resistor DAC circuit, a capacitor DAC circuit, and a resistor-capacitor DAC circuit.

11. The ASAR ADC circuit according to claim 1, further comprising a latch circuit connected between the analog signal and the first input terminal of the comparator circuit, wherein the latch circuit has an input terminal connected to the analog signal and an output terminal connected to the first input terminal of the comparator circuit.

12. A method for configuring an asynchronous successive approximation register analog-to-digital conversion (ASAR ADC) circuit, the ASAR ADC circuit having a comparator circuit, an XOR gate circuit, an ASAR logic circuit, a metastable state detection (MD) circuit, a capacitor, and a digital-to-analog converter (DAC) circuit, comprising:

connecting a first input terminal of the comparator circuit to an analog signal, a first output terminal of the comparator circuit respectively to a first input terminal of the ASAR circuit and a first input terminal of the XOR gate circuit, a second output terminal of the comparator circuit respectively to a second input terminal of the ASAR gate circuit and a second input terminal of the XOR gate circuit, and an enable signal input terminal of the comparator circuit to a control signal output terminal of the ASAR logic circuit;

connecting an output terminal of the XOR gate circuit to a third input terminal of the ASAR logic circuit and a first input terminal of the MD circuit;

connecting a second input terminal of the MD circuit to a control signal output terminal of the ASAR logic circuit, and an output terminal of the MD circuit to the first input terminal or the second input terminal of the comparator circuit through the capacitor; and connecting an input terminal of the DAC circuit to an output terminal of the ASAR logic circuit, and an output terminal of the DAC circuit to the second input terminal of the comparator circuit, wherein:

the output terminal of the ASAR logic circuit is connected to a digital signal output terminal of the ASAR DAC circuit.

13. The method according to claim 12, wherein: the MD circuit is configured to send a disturbance signal to the comparator circuit to eliminate a metastable state when a time required for completing a comparison operation deviates from a predetermined criterion.

14. The method according to claim 13, wherein the predetermined criterion is a tolerance time.

15. The method according to claim 14, wherein the tolerance time equals to a half of a least significant bit of the DAC circuit.

16. The method according to claim 13, wherein the disturbance signal is a high-level voltage.

17. The method according to claim 14, wherein the MD circuit comprises N AND gate circuits and one NAND gate circuit, N being an integer greater than 0, wherein:

a first input terminal of a first AND gate circuit is connected to the control signal output terminal of the ASAR logic circuit, the first input terminal of an $n^{th}$ AND gate circuit is connected to an output terminal of an $(n-1)^{th}$ AND gate circuit, n being greater than 2 and less than N; and an input terminal of the NAND gate circuit is connected to the output terminal of the XOR gate circuit, the output terminal of the NAND gate circuit is connected to second input terminals of the N AND gate circuits, and an output terminal of an $N^{th}$ AND gate circuit is connected to a digital signal output terminal of the MD circuit.

18. The method according to claim 17, wherein a value of N is set based on the tolerance time of a metastable state of the comparator circuit.

19. The method according to claim 12, wherein the comparator circuit includes a full differential input-output comparator.

20. The method according to claim 12, wherein a capacitance of the capacitor is in an order of femto farad.

\* \* \* \* \*